(12) United States Patent
Park et al.

(10) Patent No.: US 7,420,424 B2
(45) Date of Patent: Sep. 2, 2008

(54) POWER AMPLIFIER TRANSMISSION LINE TRANSFORMER

(75) Inventors: Changkun Park, Gyeongsangnam-do (KR); Songcheol Hong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 40 days.

(21) Appl. No.: 11/723,931

(22) Filed: Mar. 22, 2007

(65) Prior Publication Data

US 2007/0268070 A1    Nov. 22, 2007

(30) Foreign Application Priority Data

Apr. 12, 2006    (KR)    ............ 10-2006-0033237

(51) Int. Cl.
    *H03F 3/04*    (2006.01)
(52) U.S. Cl. .................................... 330/302; 330/310
(58) Field of Classification Search .............. 330/98, 330/150, 310, 302
    See application file for complete search history.

(56) References Cited

U.S. PATENT DOCUMENTS

| | | | |
|---|---|---|---|
| 5,548,246 A * | 8/1996 | Yamamoto et al. ............ 330/51 |
| 6,262,629 B1 * | 7/2001 | Stengel et al. ........... 330/124 R |
| 6,552,610 B1 | 4/2003 | Grebennikov et al. |
| 6,791,407 B2 * | 9/2004 | Grebennikov et al. ....... 330/133 |
| 6,965,837 B2 * | 11/2005 | Vintola ........................ 702/65 |
| 7,187,231 B2 * | 3/2007 | McGrath et al. .............. 330/51 |
| 7,221,221 B2 * | 5/2007 | Bouny ......................... 330/149 |
| 7,372,335 B2 * | 5/2008 | Komijani et al. ............ 330/302 |

FOREIGN PATENT DOCUMENTS

JP    A 2000-165115    6/2000

\* cited by examiner

*Primary Examiner*—Henry K Choe
(74) *Attorney, Agent, or Firm*—Oliff & Berridge, PLC

(57) ABSTRACT

Disclosed herein is a power amplifier which is used in a wireless communication system and is capable of improving efficiency in an entire output power range and extending the dynamic range without additional switches, by including a drive amplification unit and a power amplification unit, connecting the drive amplification and the power amplification unit to a matching circuit, and a power coupler included in a transmission line transformer such that the drive amplification unit drives the power amplification unit, or directly outputs power to an output terminal, through the transmission line transformer, that is, the output power of the drive amplification unit is outputted to a load by switching on/off the power amplification unit and the drive amplification unit.

7 Claims, 9 Drawing Sheets

POWER AMPLIFIER TRANSMISSION LINE TRANSFORMER

BACKGROUND OF THE INVENTION

1. Field of the Invention

The present invention relates to a power amplifier, and more particularly to a power amplifier used in a wireless communication system and is capable of improving the efficiency of an entire output power range and extending an dynamic range without additional switches, by including a drive amplification unit and a power amplification unit, connecting the drive amplification and the power amplification unit to a matching circuit, and a power coupler included in a transmission line transformer such that the drive amplification unit drives the power amplification unit or directly outputs power to an output terminal through the transmission line transformer, that is, the output power of the drive amplification unit is output to a load by switching on/off the power amplification unit and the drive amplification unit.

2. Description of the Related Art

In order to increase efficiency over an entire output power range, a power amplifier for a wireless communication system mainly uses a method of switching on/off a portion of circuits. That is, all circuits are switched on when high power is necessary, and a portion of circuits is switched off when low power is necessary, thereby increasing efficiency in the entire range.

Such a power amplifier is used when a transmitter of a wireless communication system transmits high power through an antenna.

FIG. 1 is a schematic diagram showing the configuration of a general power amplifier having a polar structure, which is a type of wireless communication system.

As shown, in the power amplifier having a polar structure, phase information and envelope information are applied as an input signal, unlike a general linear power amplifier.

The phase information, of which the level is uniform and the phase is changed, is inputted to a radio frequency (RF) input part of a driving amplifier, similar to the general linear power amplifier.

The envelope information is inputted to the power amplifier as a source voltage through a DC-DC converter. The high output power is outputted when the source voltage increases, and the low output power is outputted when the source voltage decreases.

Since the power amplifier having a polar structure can more simplify the structure of a transmitter, compared with the existing linear power amplifier, and a non-linear power amplifier having high efficiency can be used the entire efficiency of the system is improved.

Accordingly, the power amplifier having a polar structure is attracting attention as a next-generation transmitter for a global system for mobile communications (GSM) and an enhanced data GSM environment (EDGE).

Generally, since a RF signal applied to a power amplifier is very weak in driving a power amplification unit, a signal amplified by a primary drive amplification unit and a secondary drive amplification unit drives a power amplification unit to output an RF output signal, as shown in FIG. 1.

Since the general power amplifier is designed such that maximum efficiency is obtained when the output power is at a maximum, the efficiency of the power amplifier deteriorates at a low output power range.

At the low output power range, it is disadvantageous that the level of the signal outputted from the secondary drive amplification unit may become larger than that of the output power of the power amplification unit.

Accordingly, in order to solve such a problem, a plurality of power amplification units is included, as shown in FIG. 2. All the power amplification units are switched on when high output power is outputted and a portion of the power amplification units is switched on when low output power is outputted, such that high efficiency can be obtained in the entire output power range of the power amplifier and the dynamic range of the power amplifier can extend.

However, even in this structure, it is disadvantageous that the level of a signal outputted from the secondary drive amplification unit may become larger than that of the output power of the power amplification units, similar to the general power amplifier shown in FIG. 1.

Accordingly, in order to solve the problem, a power amplifier using switches is suggested as shown in FIG. 3.

In this structure, when middle output power is outputted, the output power of a secondary drive amplification unit is outputted as the output power of the power amplifier by switching off the power amplification unit and switching on a second switch. When low output power is outputted, the output power of a primary drive amplification unit is outputted as the output power of the power amplifier by switching off the power amplification unit and the secondary drive amplification unit, and switching on the first and second switches.

The output power of the primary drive amplification unit or the secondary drive amplification unit is outputted as the final output power of the power amplifier using the switches such that the above-described problem can be solved.

Since the power amplification unit and the secondary drive amplification unit are switched off in the low output power range, it is possible to prevent DC power from being consumed in the power amplification unit and the secondary drive amplification unit to improve the entire efficiency of the power amplifier and to extend the dynamic range.

However, in this case, it is disadvantageous that additional switches are required for outputting the output power of the drive amplification unit as the output power of the power amplifier when the power amplification unit or the secondary drive amplification unit is switched off.

Parasitic resistance components in the additional switches lead to the loss of the output power and the performance deterioration of the power amplifier. In order to prevent the loss of the output power and the performance deterioration of the power amplifier, the sizes of the switches must significantly increase. In this case, the size of the circuit increases and the manufacturing cost of the power amplifier increases.

SUMMARY OF THE INVENTION

Therefore, the present invention has been made in view of the above problems, and it is an object of the present invention to provide a power amplifier which is used in a wireless communication system and is capable of improving efficiency in an entire output power range and extending the dynamic range without additional switches, by including a drive amplification unit and a power amplification unit, connecting the drive amplification and the power amplification unit to a matching circuit and a power coupler included in a transmission line transformer such that the drive amplification unit drives the power amplification unit or directly outputs power to an output terminal through the transmission line transformer, that is, the output power of the drive amplification unit is outputted to a load by switching on/off the power amplification unit and the drive amplification unit.

In accordance with an aspect of the present invention, the above and other objects can be accomplished by the provision of a power amplifier using a transmission line transformer, including: a drive amplification unit; and a power amplification unit, wherein the drive amplification unit and the power amplification unit are connected to a matching circuit and a power coupler such that the drive amplification unit drives the power amplification unit and outputs an output signal to an output terminal through the matching circuit and the power coupler, and wherein the matching circuit and the power coupler configure the transmission line transformer including a secondary transmission line connected to the output terminal and a plurality of primary transmission lines which are correspondingly located at the both sides of the secondary transmission line and have different parasitic components, one of the primary transmission lines being connected to the drive amplification unit and the other one thereof being connected to the power amplification unit.

Preferably, any one of the drive amplification unit and the power amplification unit may be selectively switched on/off.

Preferably, any one of the drive amplification unit and the power amplification unit may be selectively switched on/off according to a high power mode or a low power mode.

Preferably, the matching circuit may include the transmission line transformer and parasitic capacitance components of transistors in the drive amplification unit and the power amplification unit.

Preferably, the plurality of primary transmission lines may have different cross-sectional areas.

Preferably, the plurality of primary transmission lines and the secondary transmission line may be coupled to each other with different coupling factors.

Preferably, the plurality of primary transmission lines may have different lengths.

According to the present invention, since the drive amplification unit drives the power amplification unit and automatically outputs power through the matching circuit when the power amplification unit is switched off at the low output power range, it is possible to improve the efficiency and the dynamic range of the power amplifier.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

While the invention has been shown and described with respect to the preferred embodiments, it will be understood by those skilled in the art that various changes and modifications may be made without departing from the scope and spirit of the invention. Thus, the scope of the invention should not be limited by the embodiments of the present invention.

Figure 4:
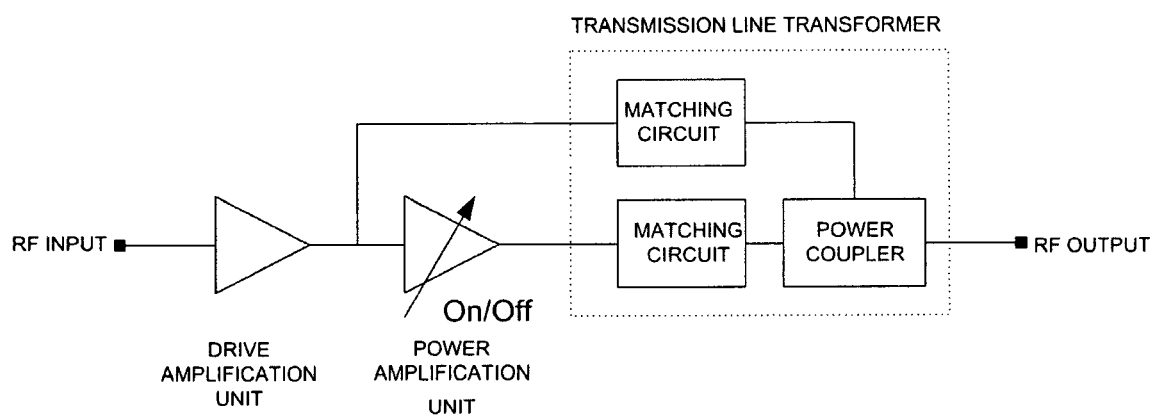
FIG. 4 is a diagram showing the configuration of a power amplifier using a transmission line transformer according to an embodiment of the present invention.

FIG. 4 is a diagram showing the configuration of a power amplifier using a transmission line transformer according to an embodiment of the present invention.

As shown, the power amplifier includes a drive amplification unit and a power amplification unit which are connected to a matching circuit and a power coupler. When high output power is necessary, both the amplification units are switched on to obtain high efficiency in a high output power range, and when low output power is necessary, the power amplification unit is switched off such that the output power of the drive amplification unit is outputted to a load through the matching circuit and the power coupler.

In this case, when the power amplification unit is switched off, the power is prevented from being consumed in the power amplification unit and thus high efficiency can be obtained in a low output power range of the power amplifier.

Figure 1:
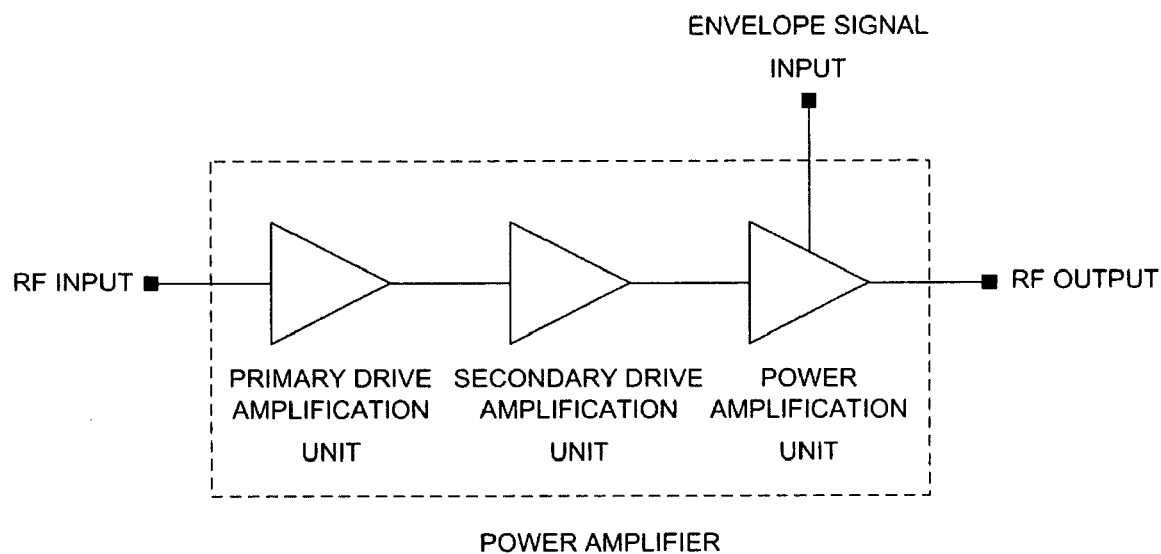
FIG. 1 is a diagram showing the configuration of a general power amplifier.
Figure 2:
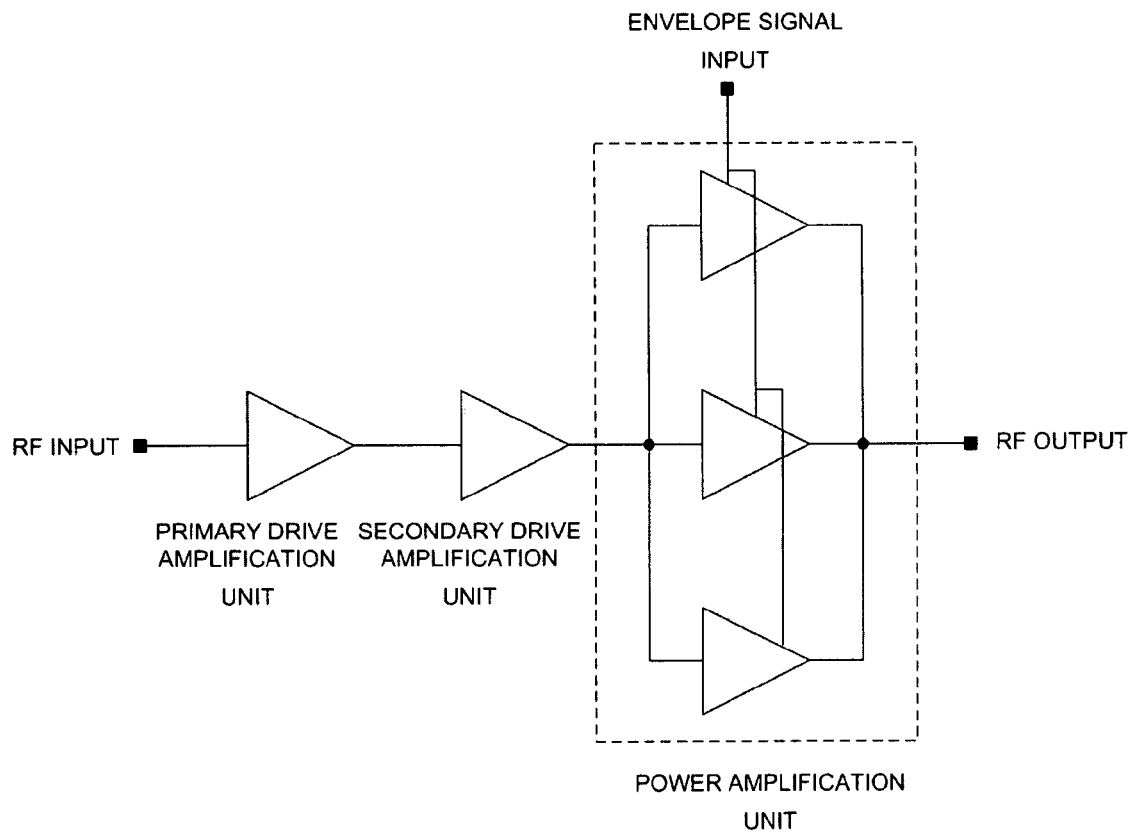
FIG. 2 is a diagram showing the configuration of a power amplifier having three power amplification units.
Figure 3:
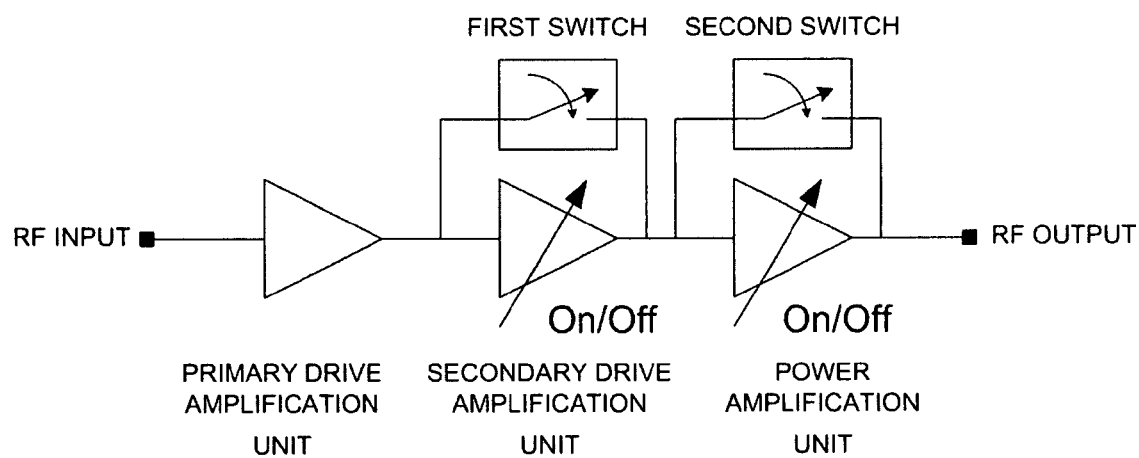
FIG. 3 is a diagram showing the configuration of a power amplifier using a switch.

In addition, since the additional switches shown in FIG. 3 are not used, the performance deterioration of the power amplifier due to the loss of the output power caused in the switches is not caused.

Figure 5:
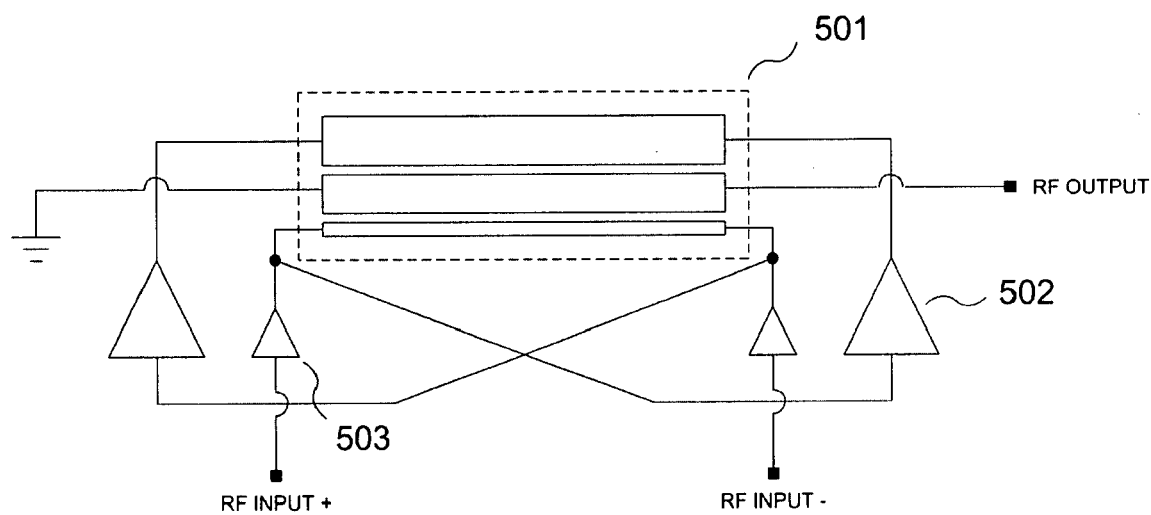
FIG. 5 is a circuit diagram showing the configuration of the power amplifier using the transmission line transformer according to the embodiment of the present invention.

FIG. 5 is a circuit diagram showing the configuration of the power amplifier according to the embodiment of the present invention.

As shown, the power amplifier has the structure of a differential amplifier and includes a power amplification unit 502 for outputting high output power and a drive amplification unit 503 which drives the power amplification unit 502 and is connected to the load impedance through the matching circuit included in a transmission line transformer 501.

At this time, the transmission line transformer 501 including the matching circuit includes a secondary transmission line connected to an output terminal and a plurality of primary transmission lines which are correspondingly located at the both sides of the secondary transmission line and have different parasitic components. One primary transmission line is connected to the drive amplification unit 503 and the other primary transmission line is connected to the power amplification unit 502.

Accordingly, unlike the general power amplification, the drive amplification unit 503 drives the power amplification unit 502 and outputs power through the transmission line transformer 501 as the output power.

Since the power generated at the drive amplification unit 503 contributes to the output power of the power amplifier, the drive amplification unit 503 of the power amplifier may serve as a portion of the power amplification unit 502. Accordingly, the size of the power amplification unit of the power amplifier for outputting the same output power may be smaller than that of the existing power amplifier.

When high output power is outputted, both the drive amplification unit 503 and the power amplification unit 502 are switched on such that the output power generated at the power amplification unit 502 and the drive amplification unit 503 is outputted as the output power of the power amplifier.

When low output power is outputted, the power amplification unit 502 is switched off such that the output power generated at the drive amplification unit 503 is outputted through the transmission line transformer 501 as the output power.

In the present embodiment, the transmission line transformer 501 is positioned between the drive amplification unit 503 and the power amplification unit 502 such that parasitic capacitance components of the transistors included in the drive amplification unit 503 and the power amplification unit 502 and the transmission line transformer 501 automatically serve as the matching circuit.

If the parasitic capacitance value of the matching circuit is low, an additional capacitor may be provided to the matching circuit.

Figure 6:
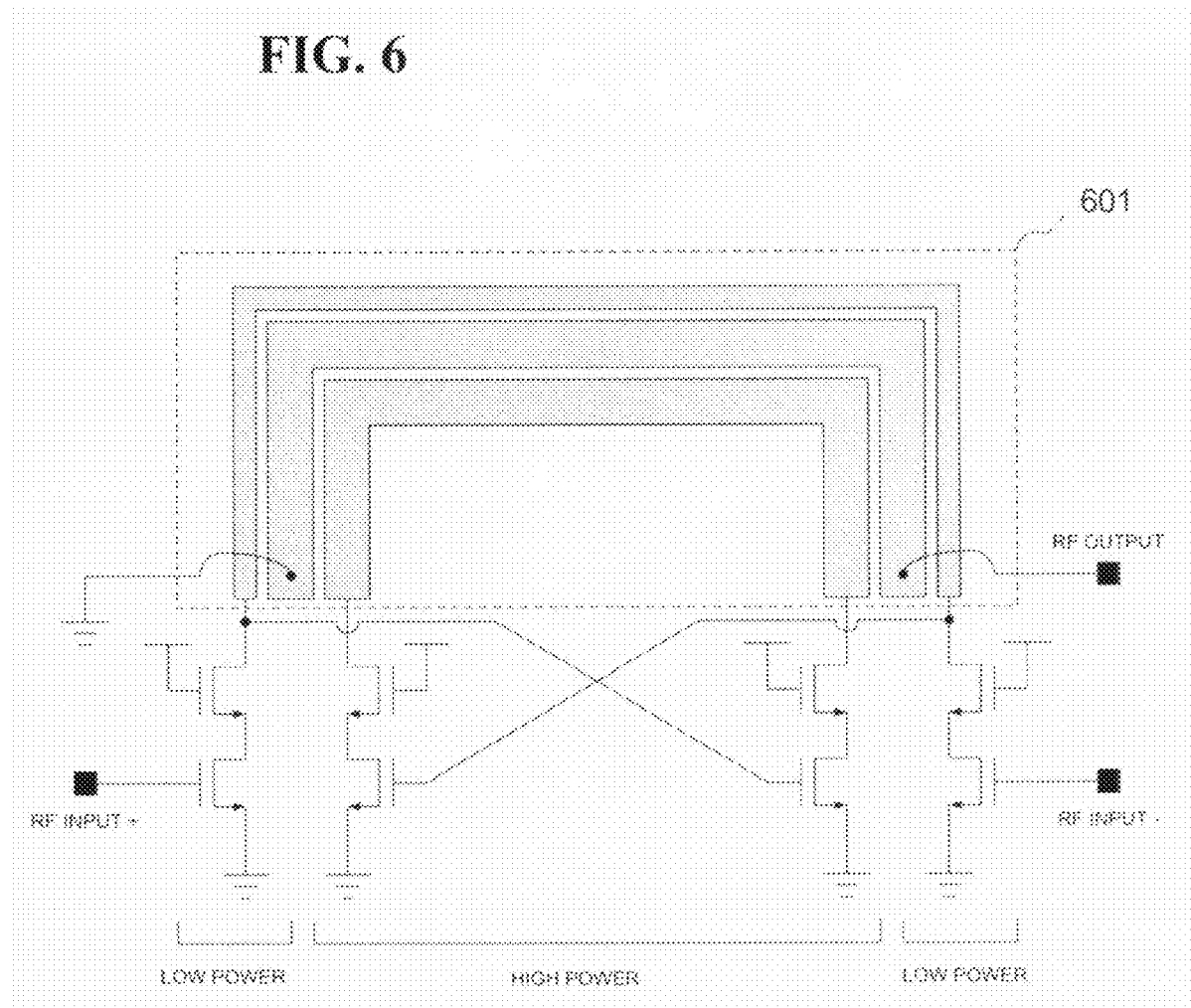
FIG. 6 is a circuit diagram showing in more detail the configuration of the power amplifier shown in FIG. 5 using CMOSs.

FIG. 6 is a circuit diagram showing in more detail the configuration of the power amplifier shown in FIG. 5 using CMOSs.

As shown, the drive amplification unit and the power amplification unit are configured using CMOSs, a low power transistor serves as the drive amplification unit and the drain of the low power transistor is connected to the gate of a high power transistor.

A secondary transmission line of a transmission line transformer 601 including the matching circuit is connected to a RF output terminal. One of a plurality of primary transmission lines is connected to the gate of the high power transistor, and the other one thereof is connected to the gate of the low power transistor.

The structure of the transmission line transformer used herein has the plurality of primary transmission lines having different parasitic components such that a plurality of load impedances are obtained and used in a necessary circuit.

The primary transmission lines of transmission line transformer may have different lengths, cross-sectional areas and coupling factors such that a load impedance value can be changed.

Figure 7:
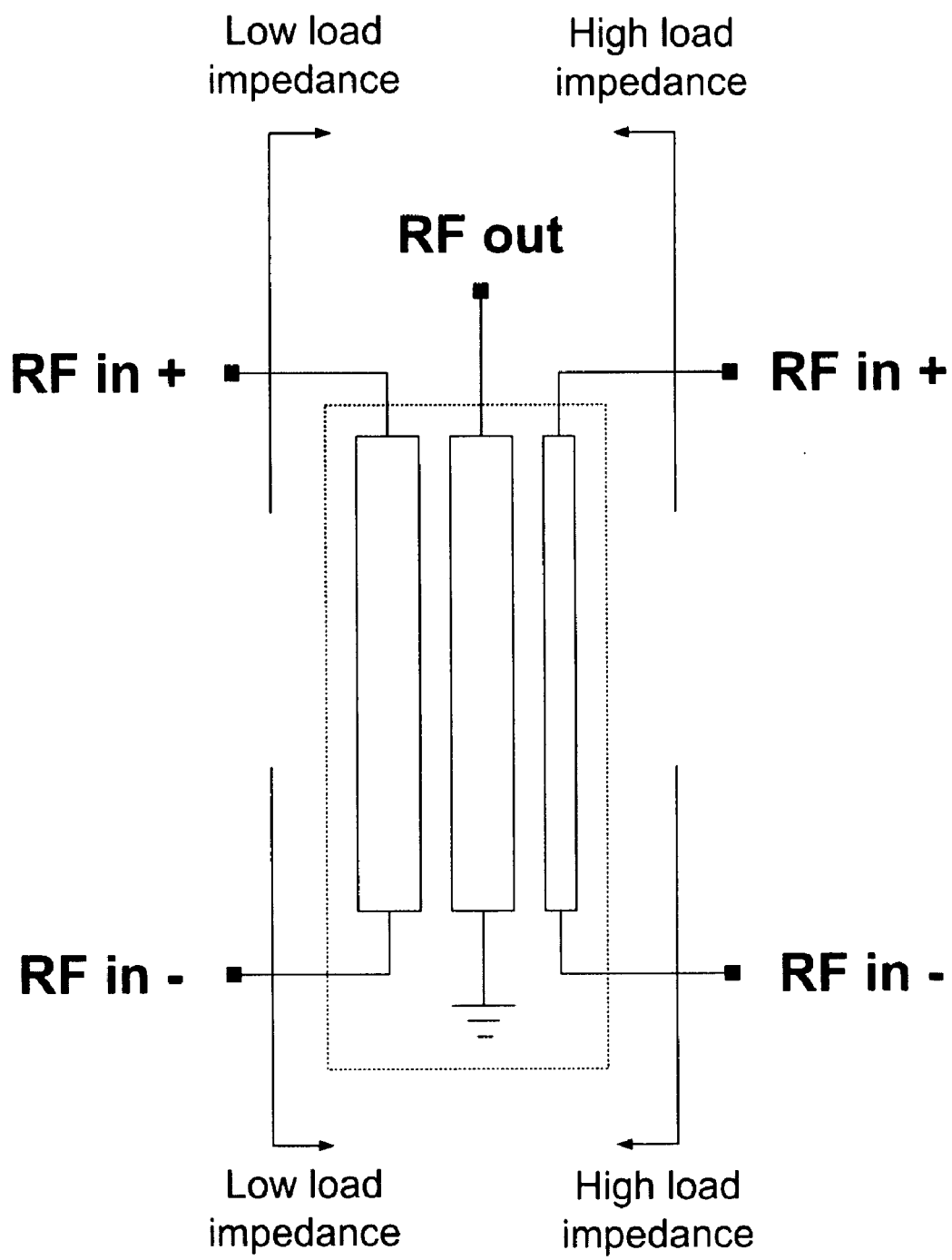
FIG. 7 is a diagram showing the configuration of the transmission line transformer including a matching circuit, in the power amplifier using the transmission line transformer according to the embodiment of the present invention.
Figure 8:
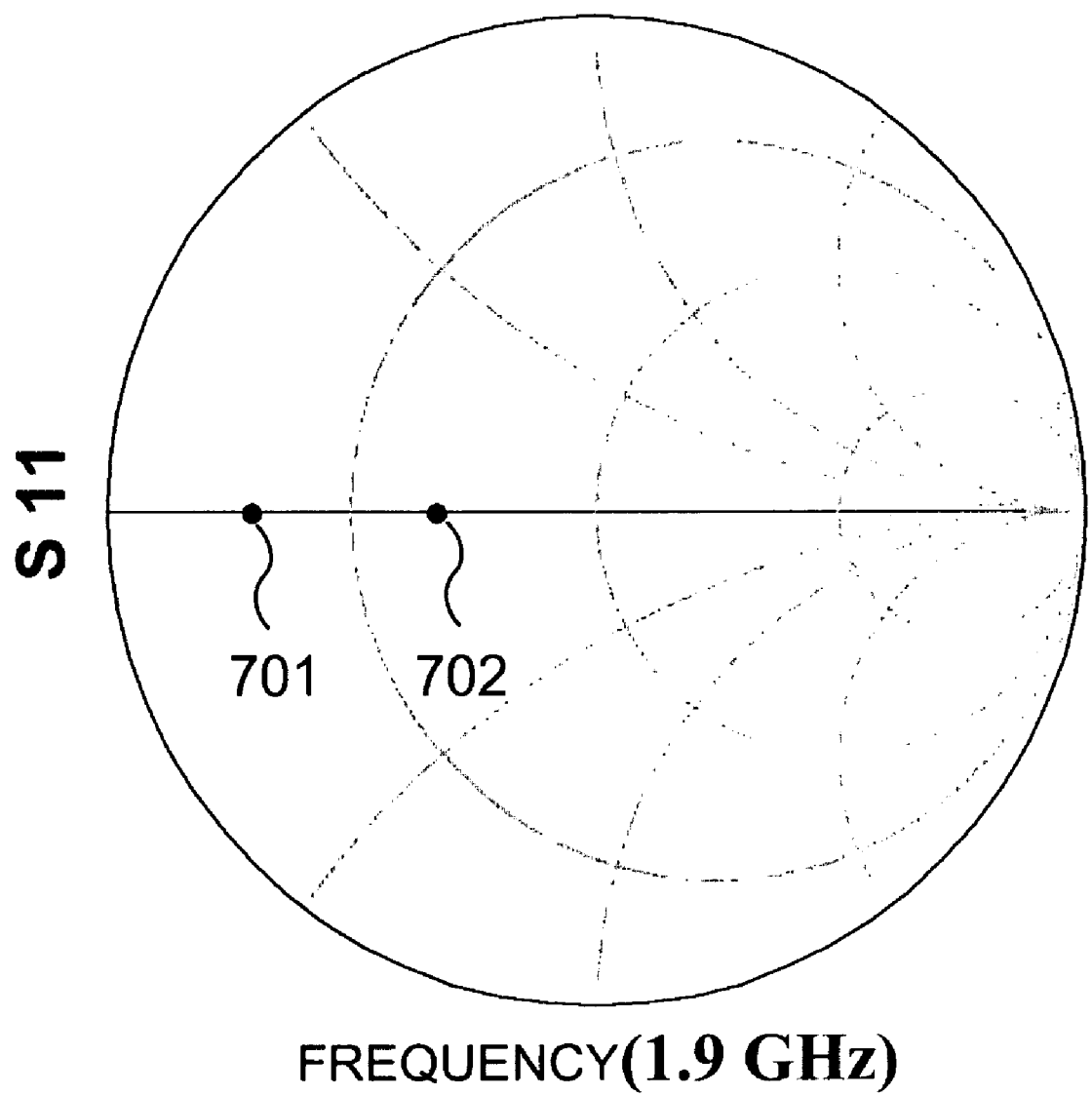
FIG. 8 is a smith chart showing a method of changing impedance by the matching circuit included in the transmission line transformer shown in FIG. 7.

FIG. 8 is a smith chart showing a method of changing impedance by the matching circuit included in the transmission line transformer shown in FIG. 7.

As shown, a reference numeral 701 denotes the change from a load impedance of 50Ω connected to the secondary side to a low load impedance by a primary side of the transmission line transformer and a reference numeral 702 denotes the change from a load impedance of 50Ω connected to the secondary side to a high load impedance by another primary side of the transmission line transformer as the result of computer simulation.

In order to output high output power, the power amplifier must reduce the load impedance value. However, a low load impedance value is a major factor in deteriorating the efficiency of the power amplifier when the low output power is outputted.

Accordingly, in order to solve such a problem, the transmission line transformer having the plurality of load impedances is used as shown in FIG. 7. That is, when the low output power is outputted, only the transistors connected to the primary side and having the high load impedance operate such that the low output power can be outputted while maintaining high efficiency. When the high output power is outputted, the transistors connected to the primary side and having the low load impedance also operate such that the high output power can be output.

Under a general source voltage condition, the output power of the power amplifier decreases as the load impedance value increases. Accordingly, since the power amplifier according to the present invention uses the transmission line transformer having the plurality of load impedance values, the dynamic range of the power amplifier can extend and high efficiency can be obtained even in a low output power range.

Figure 9:
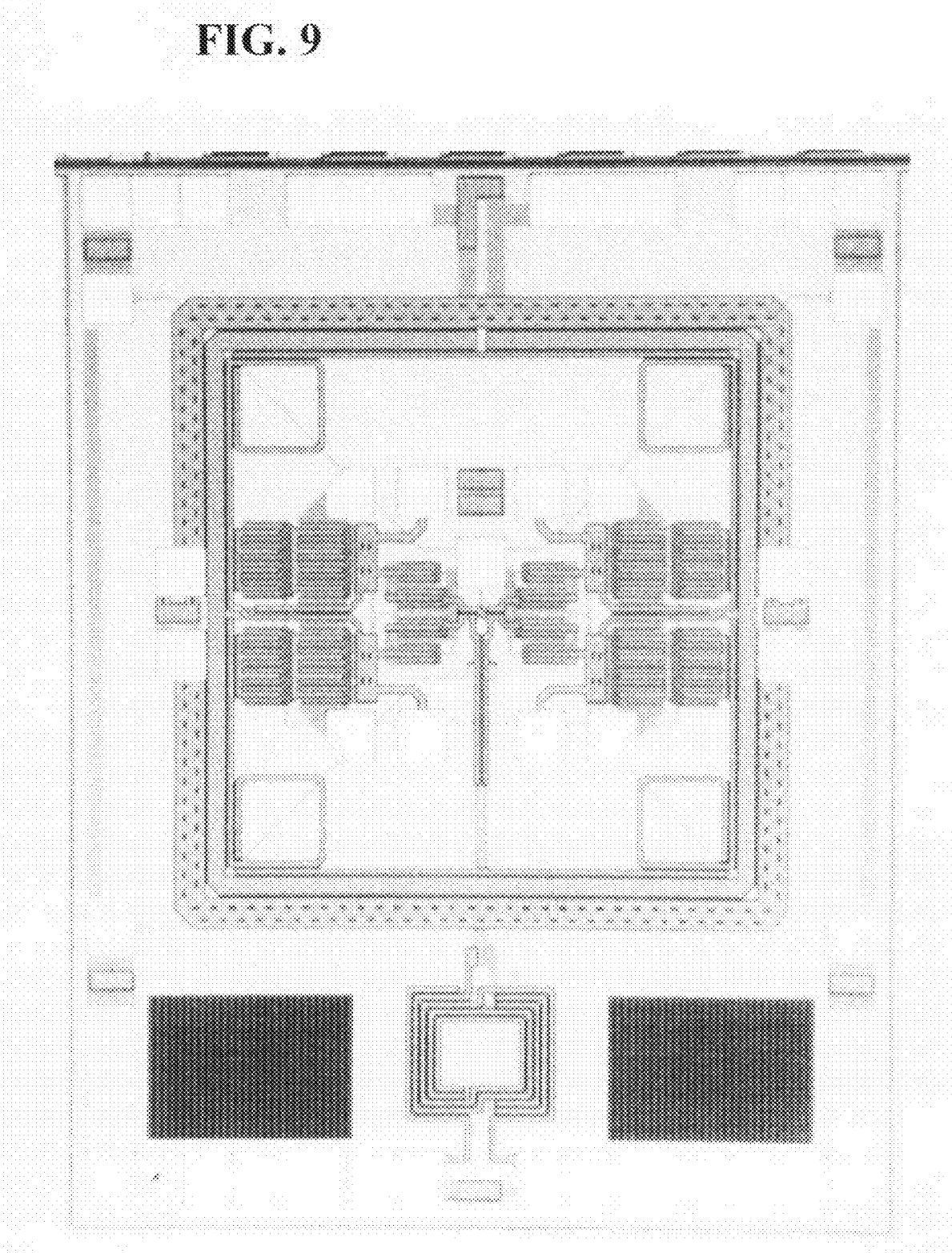
FIG. 9 is a picture of an actual integrated circuit in which the power amplifier using the transmission line transformer according to the present invention is embodied using a 0.18-μm CMOS process.

FIG. 9 is a picture of an actual integrated circuit in which the power amplifier using the transmission line transformer according to the present invention is embodied using a 0.18-μm CMOS process.

The picture shown herein shows the power amplifier according to the present invention which is actually embodied in a microwave monolithic integrated circuit (MMIC) using the 0.18-μm CMOS process. The whole size of the circuit is 1.3 mm×1.7 mm. Since the structure of the differential amplifier is used, a transformer is used in an input unit such that in-phase input signals are converted into differential signals.

Figure 10:
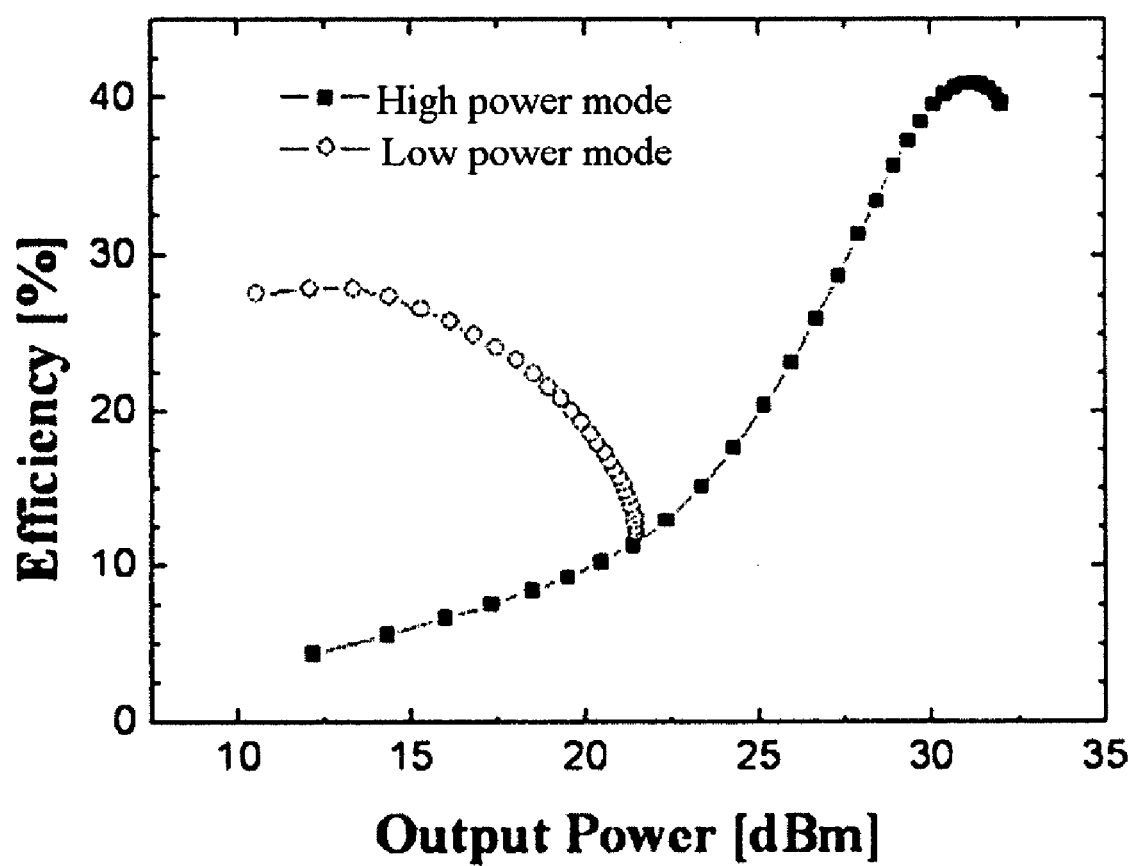
FIG. 10 is a graph showing the actual measured result of the power amplifier using the transmission line transformer according to the present invention.

FIG. 10 is a graph showing the actual measured result of the power amplifier using the transmission line transformer according to the present invention.

The graph shown herein shows the actual measured result of the power amplifier according to the present invention, in which both the drive amplification unit and the power amplification unit are switched on in a high power mode and the power amplification unit is switched off and only the drive amplification unit is switched on in a low power mode such that the output power generated at the drive amplification unit is outputted through the transmission line transformer as the output power.

At this time, the result of measuring the output power and the efficiency while varying the source voltage of the power amplifier from 0.5 to 3.3 V in the high power mode and the low power mode is shown.

When the power amplifier operates in the low power mode, it can be seen that the efficiency increases in the low output power range and the dynamic range of the power amplifier is improved by about 4 dB by using the low power mode.

From the above-described result, it can be seen that the efficiency increases and the dynamic range extends in the low output power range.

As described above, according to the present invention, a power amplifier used in a wireless communication system includes a drive amplification unit and a power amplification unit, the amplification units are connected to a matching circuit and a power coupler, and the drive amplification unit drives the power amplification unit and directly outputs power through a transmission line transformer as output power. That is, the output power of the drive amplification unit can be outputted to a load by switching on/off the power amplification unit and the drive amplification unit. Accordingly, efficiency can increase over an entire output power range and a dynamic range can extend without additional switches.

Although the preferred embodiments of the present invention have been disclosed, those skilled in the art will appreciate that various modifications, additions and substitutions are possible, without departing from the scope and spirit of the invention as disclosed in the accompanying claims.

What is claimed is:

1. A power amplifier using a transmission line transformer, the power amplifier comprising:
   a drive amplification unit; and
   a power amplification unit, wherein the drive amplification unit and the power amplification unit are connected to a matching circuit and a power coupler such that the drive amplification unit drives the power amplification unit and outputs an output signal to an output terminal through the matching circuit and the power coupler, wherein the matching circuit and the power coupler configure the transmission line transformer including a secondary transmission line connected to the output terminal and a plurality of primary transmission lines which are correspondingly located at the both sides of the secondary transmission line and have different parasitic components, one of the primary transmission lines being connected to the drive amplification unit and the other one thereof being connected to the power amplification unit.

2. The power amplifier according to claim 1, wherein any one of the drive amplification unit and the power amplification unit is selectively switched on/off.

3. The power amplifier according to claim 2, wherein any one of the drive amplification unit and the power amplification unit is selectively switched on/off according to a high power mode or a low power mode.

4. The power amplifier according to claim 1, wherein the matching circuit includes the transmission line transformer and parasitic capacitance components of transistors in the drive amplification unit and the power amplification unit.

5. The power amplifier according to claim 1, wherein the plurality of primary transmission lines have different cross-sectional areas.

6. The power amplifier according to claim 1, wherein the plurality of primary transmission lines and the secondary transmission line are coupled to each other with different coupling factors.

7. The power amplifier according to claim 1, wherein the plurality of primary transmission lines have different lengths.

* * * * *